(12) United States Patent
Kim et al.

(10) Patent No.: US 7,706,210 B2
(45) Date of Patent: Apr. 27, 2010

(54) SEMICONDUCTOR MEMORY DEVICE INCLUDING DELAY LOCKED LOOP AND METHOD FOR DRIVING THE SAME

(75) Inventors: Jee-Yul Kim, Kyoungki-do (KR); Beom-Ju Shin, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 342 days.

(21) Appl. No.: 11/819,564

(22) Filed: Jun. 28, 2007

(65) Prior Publication Data
US 2008/0232180 A1    Sep. 25, 2008

(30) Foreign Application Priority Data
Oct. 31, 2006    (KR) .................. 10-2006-0106780

(51) Int. Cl.
*G11C 8/00* (2006.01)
(52) U.S. Cl. .................. 365/233.1; 365/191; 365/194
(58) Field of Classification Search .................. 365/194, 365/191, 233.1
See application file for complete search history.

(56) References Cited

U.S. PATENT DOCUMENTS

| | | | |
|---|---|---|---|
| 6,446,180 B2 | 9/2002 | Li et al. | |
| 6,977,848 B2 | 12/2005 | Choi | |
| 6,982,924 B2 | 1/2006 | Na | |
| 6,987,705 B2 | 1/2006 | Kim et al. | |
| 7,027,336 B2 | 4/2006 | Lee | |
| 7,081,784 B2 | 7/2006 | Kang | |
| 2005/0122796 A1* | 6/2005 | Jung et al. | ......... 365/194 |
| 2007/0008758 A1* | 1/2007 | Waldrop | ......... 365/5 |

FOREIGN PATENT DOCUMENTS

| | | |
|---|---|---|
| JP | 2004-327008 | 11/2004 |
| KR | 10-2005-0041613 A | 5/2005 |
| KR | 10-2005-0109813 A | 11/2005 |

OTHER PUBLICATIONS

Korean Notice of Allowance issued in Korean Patent Application No. KR 10-2006-0106780, dated Apr. 24, 2008.

* cited by examiner

*Primary Examiner*—Hoai V Ho
(74) *Attorney, Agent, or Firm*—IP & T Law Firm PLC

(57) ABSTRACT

A semiconductor memory device includes: a delay locked loop (DLL) for delaying an external clock to generate a DLL clock signal; an internal command signal generator for generating an internal command signal in response to an external command; a delay circuit for delaying the internal command signal by a delay time corresponding to a delay time of the DLL to output a delayed internal command signal; and an output enable signal generator for generating an output enable signal based on the delayed internal command signal and the DLL clock signal.

14 Claims, 6 Drawing Sheets

SEMICONDUCTOR MEMORY DEVICE INCLUDING DELAY LOCKED LOOP AND METHOD FOR DRIVING THE SAME

CROSS-REFERENCE TO RELATED APPLICATIONS

The present invention claims priority of Korean patent application number 10-2006-0106780, filed on Oct. 31, 2006, which is incorporated by reference in its entirety.

BACKGROUND OF THE INVENTION

The present invention relates to a semiconductor device, and more particularly, to a semiconductor memory device, which generates an output enable signal in synchronization with a DLL clock signal, and a method for driving the same.

Synchronous memory devices, e.g., double data rate (DDR) synchronous dynamic random access memory (SDRAM), are designed to generate a plurality of output enable signals in synchronization with a DLL clock signal (CLK_DLL) and having different pulse widths according to a burst length, and to selectively use one of them according to a column address strobe (CAS) latency.

FIG. 1 is a block diagram of a conventional semiconductor memory device.

Referring to FIG. 1, an internal command signal generator 10 receives external command signals to generate a plurality of internal command signals according to their combination. Examples of the external command signals include a chip select signal CS, a write enable signal WE, a row address strobe signal RAS, a column address strobe signal CAS. Examples of the internal command signals include an internal read command signal IRDP. The internal command signal IRDP contains information on period (tCK) of an external clock signal CLK_EXT and is a pulse signal activated in response to an external read command (RD).

The synchronous semiconductor memory device such as a DDR SDRAM transfers data to other external devices using a delay locked loop (DLL) clock signal (CLK_DLL) produced by delaying a clock signal CLK_EXT inputted from an external device such as a memory controller. Such a clock synchronization circuit includes a phase locked loop (PLL) and a delay locked loop (DLL). The DLL is widely used in semiconductor devices because it has low noise and can be implemented in a small area compared with the PLL.

FIG. 2 is a block diagram of the DLL 20 illustrated in FIG. 1.

Referring to FIG. 2, the DLL 20 includes a clock buffer 21, a first delay line 23, a second delay line 22, a duty cycle corrector 24, a delay replica model 25, a phase comparator 26, and a delay controller 27. The clock buffer 21 buffers an external clock signal CLK_EXT and an external clock bar signal CLKB_EXT to generate a reference clock signal CLK_REF. The external clock bar signal CLKB_EXT is a clock signal having an opposite phase to the external clock signal CLK_EXT. The second delay line 22 delays the reference clock signal CLK_REF corresponding to the external clock signal CLK_EXT in response to a control signal CTR. The first delay line 23 delays a clock signal produced by buffering the external clock bar signal CLKB_EXT in response to the control signal CTR. The duty cycle corrector 24 corrects duty cycles of output signals of the first and second delay lines 23 and 22 to generate rising and falling DLL clock signals RCLK_DLL and FCLK_DLL. The delay replica model 25 delays the DLL clock signal RCLK_DLL through delay elements located in a clock path to generate a feedback clock signal CLK_FDB. The phase comparator 26 compares a phase of the reference clock signal CLK_REF with that of the feedback clock signal CLK_FDB. The delay controller 27 generates the control signal CTR according to an output signal of the phase comparator 26.

The rising DLL clock signal RCLK_DLL has a phase equal to that of the external clock signal CLK_EXT, the falling DLL clock signal FCLK_DLL has a phase opposite to that of the external clock signal CLK_EXT. For convenience, the DLL will be described, centering on the external clock signal CLK_EXT and the rising DLL clock signal RCLK_DLL.

The DLL 20 generates the rising DLL clock signal RCLK_DLL by compensating a clock delay component occurring while the rising DLL clock signal RCLK_DLL is transferred to a data output terminal of the semiconductor memory device, so that signals used for an input/output of a final data can be synchronized with the external clock signal CLK_EXT.

Referring again to FIG. 1, an output enable signal generator 30 receives the CAS latency CL, the burst length BL, the internal read command signal IRDP, and the rising DLL clock signal RCLK_DLL to generate output enable signals OE0, OE1, OE1.5, . . . , OEN, where n is a natural number or (natural number+0.5).

In other words, the internal read command signal IRDP is a pulse signal that is activated in response to the read command, and the output enable signal OE0 is a signal that is activated after a predetermined time elapses from the activation of the internal read command signal IRDP. The output enable signal OE0 has a pulse width corresponding to the burst length BL. The output enable signals OE1, OE1.5, . . . , OEN are signals that are produced by shifting the output enable signal OE0. The output enable signals OE1, OE1.5, . . . , OEN, except the output enable signal OE0, are signals that are activated in synchronization with rising or falling edges of the rising DLL clock signal RCLK_DLL. Generally, the output enable signal generator 30 is designed to generate a plurality of output enable signals OE1, OE1.5, . . . , OEN in synchronization with the rising or falling edges of the rising DLL clock signal RCLK_DLL, such that the output enable signals can be selectively used according to the CAS latency CL.

FIG. 3 is a block diagram of the output enable signal generator 30 illustrated in FIG. 1.

Referring to FIG. 3, the output enable signal generator 30 includes a delay option unit 31, an OE0 generating unit 32, an OE1 generating unit 33, an OE1.5 generating unit 34, . . . , and an OEN generating unit 35. The delay option unit 31 receives the rising DLL clock signal RCLK_DLL and the CAS latency CL to tune the rising DLL clock signal RCLK_DLL according to the CAS latency CL. The OE0 generating unit 32 receives the internal read command signal IRDP and the burst length BL to generate the output enable signal OE0. The OE1 generating unit 33 receives the output enable signal OE0 and an output signal TN_RCLK_DLL of the delay option unit 31 to generate the output enable signal OE1. The OE1.5 generating unit 34 receives the output enable signal OE1 and the output signal TN_RCLK_DLL of the delay option unit 31 to generate the output enable signal OE1.5. Likewise, the OEN generating unit 35 generates the output enable signal OEN. The OE1 to OEN generating units 32, 33, 34, . . . , 35 perform a reset operation in response to a reset signal OE_RESTB.

The delay option unit 31 includes a plurality of delay elements and a plurality of option circuits in order for the tuning operation. The delay option unit 31 is provided for a domain crossing of the external clock signal CLK_EXT and the rising DLL clock signal RCLK_DLL. The domain crossing is a conversion from a receiver domain to a transmitter domain. That is, the domain crossing is a conversion from a domain in which the read command is recognized to a domain in which data is outputted in synchronization with the external clock signal CLK_EXT. The domain crossing will be described later with reference to FIGS. 5 and 6.

FIGS. 4A and 4B are circuit diagrams of the OE1 generating unit 33 and the OE1.5 generating unit 34, respectively.

Referring to FIG. 4A, the OE1 generating unit 33 includes a transfer gate TGA, a first latch 41, and a first inverter INV1. The transfer gate TGA transfers the output enable signal OE0 to the first latch 41. The first latch 41 latches an output signal of the transfer gate TGA and is reset by the reset signal OE_RESTB. The first inverter INV1 drives an output signal of the first latch 41 to output the output enable signal OE1. The transfer gate TGA is enabled during a period in which the output signal TN_RCLK_DLL of the delay option unit 31 has a logic high level.

Referring to FIG. 4B, the OE1.5 generating unit 34 includes a transfer gate TGB, a second latch 42, and a second inverter INV2. The transfer gate TGB transfers the output enable signal OE1 to the second latch 42. The second latch 42 latches an output signal of the transfer gate TGB and is reset by the reset signal OE_RESTB. The second inverter INV2 drives an output signal of the second latch 42 to output the output enable signal OE1.5. The transfer gate TGB is enabled during a period in which the output signal TN_RCLK_DLL of the delay option unit 31 has a logic low level.

The OE2 generating unit (not shown), . . . , the OEN generating unit 35 have the same configuration as the OE1 generating unit 33 of FIG. 4A, except that the output enable signal generated from the previous stage is inputted to the next stage. An OE2.5 generating unit (not shown), an OE3.5 generating unit (not shown), etc. have the same configuration as the OE1.5 generating unit 34 of FIG. 4B, except that the output enable signal generated from the previous stage is inputted to the next stage.

FIGS. 5 and 6 are timing diagrams illustrating the tuning operation of the delay option unit 31 during the domain crossing.

In FIGS. 5 and 6, it is assumed that it takes 15 ns to output the internal data to the external circuit after the input of the read command in the same semiconductor memory device. In FIG. 5, the period tCK of the external clock signal CLK_EXT is 2.5 ns, the CAS latency CL is 6, the delay time of the delay replica model 25 is 2 ns, and the delay time locked after the locking at the second delay line 22 is 0.5 ns. In FIG. 6, the period tCK of the external clock signal CLK_EXT is 5 ns, the CAS latency CL is 3, the delay time of the delay replica model 25 is 2 ns, and the delay time locked after the locking at the second delay line 22 is 3 ns.

Referring to FIG. 5, the internal read command signal IRDP is generated after a predetermined time from the input of the read command RD. The OE0 generating unit 32 of FIG. 3 receives the internal read command signal IRDP to generate the output enable signal OE0. The pulse width of the output enable signal OE0 is determined by the burst length BL. The output enable signal OE1 is generated in synchronization with a time point 1 of the rising DLL clock signal RCLK_DLL, and the output enable signal OE2 is generated in synchronization with a time point 2 of the rising DLL clock signal RCLK_DLL. The output enable signal OE3 is generated in synchronization with a time point 3 of the rising DLL clock signal CLK_DLL, and the output enable signal OE4 is generated in synchronization with a time point 4 of the rising DLL clock signal RCLK_DLL. The output enable signal OE4.5 is generated in synchronization with a time point 4.5 of the rising DLL clock signal RCLK_DLL.

Meanwhile, the reference clock signal CLK_REF is the buffered external clock signal and is substantially equal to the external clock signal CLK_EXT. The rising DLL clock signal RCLK_DLL is produced by delaying the reference clock signal by "D1" at the second delay line 22 of FIG. 2. In other words, a time point 5 of the rising DLL clock signal RCLK_DLL corresponds to a time point delayed by "D2" at the delay replica model 25 of FIG. 2, that is, a time point 5 of the reference clock signal CLK_REF. In addition, since the reference clock signal CLK_REF is substantially equal to the external clock signal CLK_EXT, the time point 5 of the reference clock signal CLK_REF is substantially equal to the time point 5 of the external clock signal EXT_CLK. When the CAS latency CL is 6, data D0 exactly synchronizes with the time point 5 of the external clock signal CLK_EXT, that is, a sixth external clock signal CLK_EXT after the input of the read command RD. Subsequently output data D1, D2 and D3 exactly synchronize with the external clock signal CLK_EXT.

In FIG. 6, the period tCK of the external clock signal CLK_EXT is 5 ns, the CAS latency CL is 3, the delay time "D2" of the delay replica model 25 is 2 ns, and the second delay line 22 of FIG. 2 has the delay time of "D3" so as to output data in 15 ns. That is, a time point 2 of the rising DLL clock signal RCLK_DLL corresponds to a time point 2 of the reference clock signal CLK_REF, and it is substantially equal to a time point 2 of the external clock signal CLK_EXT. When the CAS latency CL is 3, data D0 exactly synchronizes with the time point 2 of the external clock signal CLK_EXT, that is, a third external clock signal CLK_EXT after the input of the read command RD. Subsequently outputted data D1, D2 and D3 exactly synchronize with the external clock signal CLK_EXT.

Meanwhile, the internal read command signal IRDP is generated after a predetermined time elapses from the input of the read command RD. The OE0 generating unit 32 of FIG. 3 receives the internal read command signal IRDP to generate the output enable signal OE0. The output enable signal OE1 is generated in synchronization with the time point 0 of the rising DLL clock signal RCLK_DLL in FIG. 6, while the output enable signal OE1 is generated in synchronization with the time point 1 of the rising DLL clock signal RCLK_DLL in FIG. 5. The output enable signals generated after the output enable signal OE1 also synchronize with the rising DLL clock signal RCLK_DLL at the time points different from those of FIG. 5.

Therefore, the tuning for the domain crossing must be performed using the delay option unit 31. For example, the output enable signal OE1 must be generated such that it always synchronizes with the time point 1 of the rising DLL clock signal RCLK_DLL. That is, the output enable signal OE1 synchronizes with the time point 1 of the rising DLL clock signal RCLK_DLL by further delaying it by "D4" through the domain crossing. Therefore, the output enable signal OE2 is also synchronized with the time point 2 of the rising DLL clock signal RCLK_DLL.

The delay option unit 31 for the tuning must be configured using a plurality of delay elements and a plurality of option circuits. In addition, as the period tCK of the external clock signal CLK_EXT decreases, a more precise control is needed. Consequently, a larger number of delay elements and option circuits are required.

SUMMARY OF THE INVENTION

Embodiments of the present invention are directed to providing a semiconductor memory device that generates an output enable signal at a preset time point of a DLL clock signal without any delay element and option circuit that are necessary for a domain crossing.

In accordance with an aspect of the present invention, there is provided a semiconductor memory device, including: a delay locked loop (DLL) for delaying an external clock to generate a DLL clock signal; an internal command signal generator for generating an internal command signal in response to an external command; a delay circuit for delaying the internal command signal by a delay time corresponding to a delay time of the DLL to output a delayed internal command signal; and an output enable signal generator for generating an output enable signal based on the delayed internal command signal and the DLL clock signal.

In accordance with another aspect of the present invention, there is provided a method for driving a semiconductor memory device, including: generating a delay locked loop (DLL) clock signal by delaying an external clock signal until the external clock signal is locked by a DLL; generating an internal command signal in response to an external command; generating a delayed internal command signal by delaying the internal command signal by a delay time corresponding to a delay time of the DLL; and generating an output enable signal based on the DLL clock signal and the delayed internal command signal.

DESCRIPTION OF SPECIFIC EMBODIMENTS

Hereinafter, a semiconductor memory device and a method for driving the same in accordance with the present invention will be described in detail with reference to the accompanying drawings.

Figure 7:
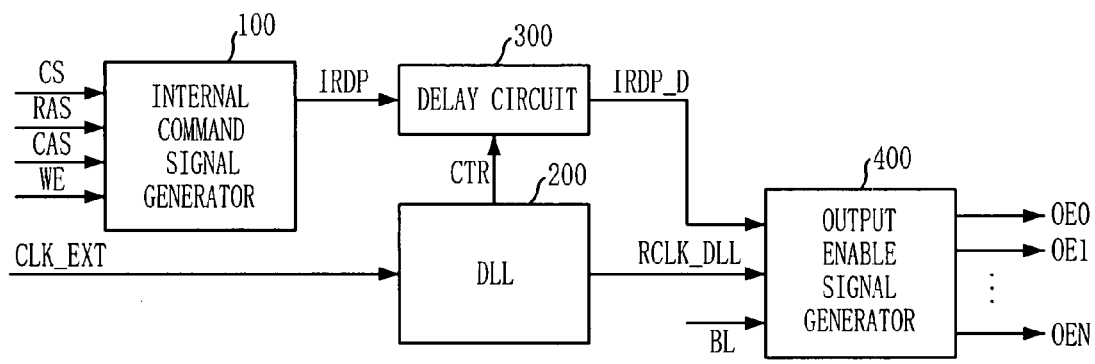
FIG. 7 is a block diagram of a semiconductor memory device in accordance with an embodiment of the present invention.

FIG. 7 is a block diagram of a semiconductor memory device in accordance with an embodiment of the present invention.

Referring to FIG. 7, the semiconductor memory device includes an internal command signal generator 100, a delay locked loop (DLL) circuit 200, a delay circuit 300, and an output enable signal generator 400.

The internal command signal generator 100 receives external command signals to generate an internal read command signal IRDP in response to a read command RD. The external command signals include a chip select signal CS, a write enable signal WE, a PAS signal RAS, and a CAS signal CAS.

The DLL circuit 200 generates a DLL clock signal CLK_DLL by delaying an external clock signal CLK_EXT until external clock signal CLK_EXT is locked. For convenience, the semiconductor memory device will be described centering on a rising DLL clock signal RCLK_DLL contained in the DLL clock signals CLK_CLK outputted from the DLL circuit 200.

The delay circuit 300 delays the internal read command signal IRDP by a delay time locked at the DLL circuit 200 in response to the control signal CTR.

The output enable signal generator 400 receives a delayed internal read command signal IRDP_D from the delay circuit 300, the rising DLL clock signal RCLK_DLL, and the burst length BL to generate output enable signals OE0, OE1, OE1.5, ..., OEN.

Figure 1:
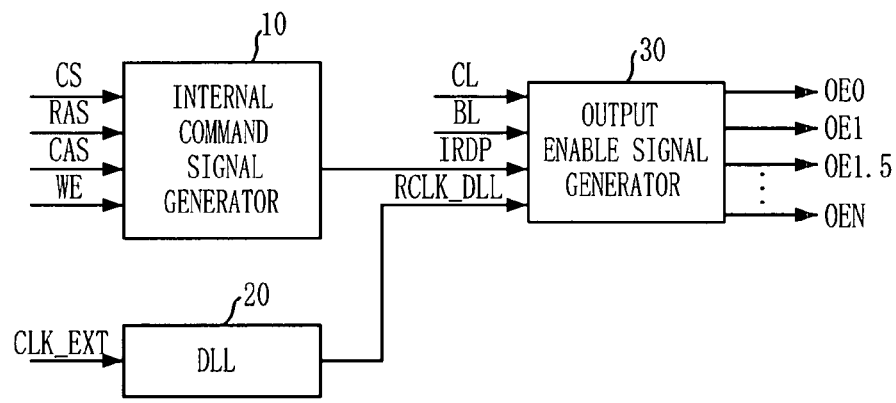
FIG. 1 is a block diagram of a conventional semiconductor memory device.
Figure 2:
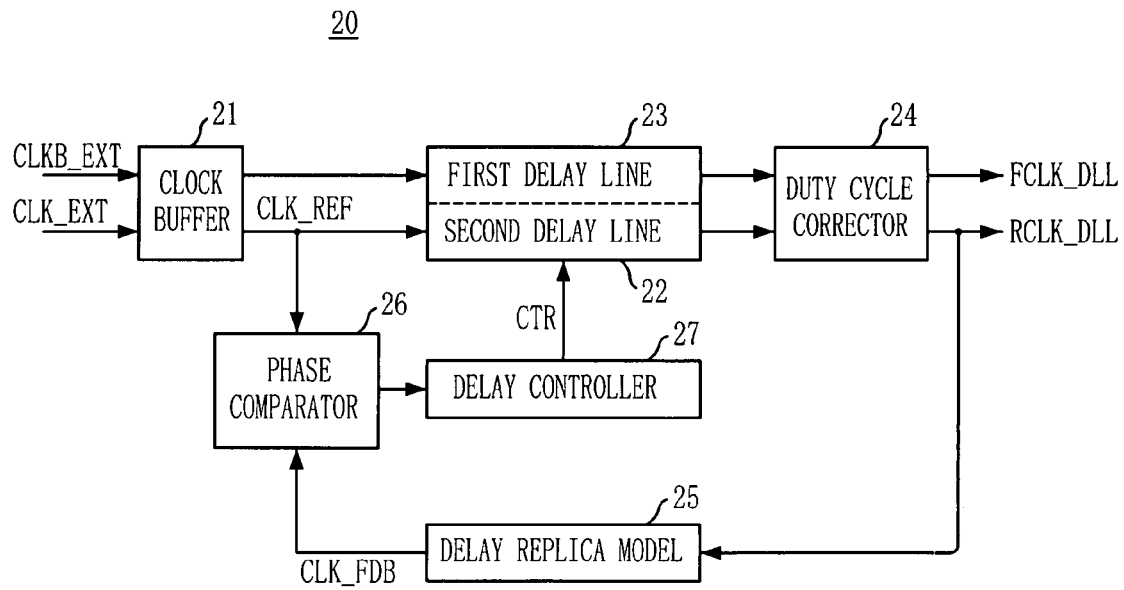
FIG. 2 is a block diagram of a DLL illustrated in FIG. 1.

Upon operation, the DLL circuit 200 compares the reference clock signal CLK_REF with the feedback clock signal CLK_FDB, and generates the rising DLL clock signal RCLK_DLL by delaying the external clock signal CLK_EXT by the delay time of the second delay line 22 of FIG. 2 until the external clock signal CLK_EXT is locked. Meanwhile, if the internal read command signal IRDP is generated in response to the read command RD, the delay circuit 300 delays the internal read command signal IRDP by the delay time of the second delay line 22. The output enable signal generator 400 generates the output enable signals OE0, OE1, OE1.5, ..., OEN activated at a preset time point of the rising DLL clock signal RCLK_DLL in response to the delayed internal read command signal IRDP_D.

Since the internal command signal generator 100 and the DLL circuit 200 have the substantially same configuration as those of the related art, their detailed description will be omitted. Hereinafter, the delay circuit 300 and the output enable signal generator 400 will be described in detail.

Figure 8:
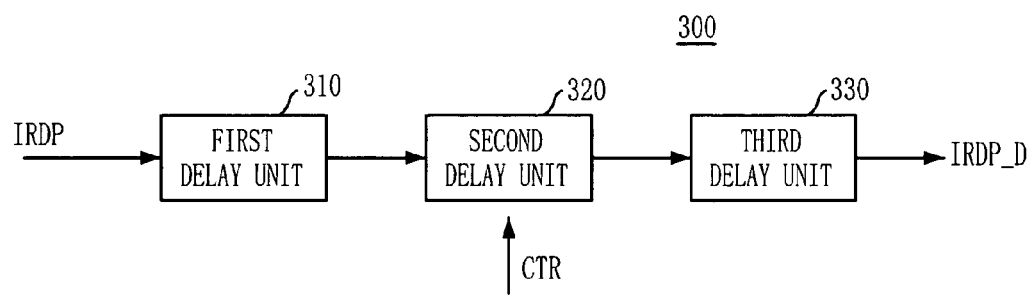
FIG. 8 is a block diagram of a delay circuit illustrated in FIG. 7.

FIG. 8 is a block diagram of the delay circuit 300 illustrated in FIG. 7.

Referring to FIG. 8, the delay circuit 300 includes a first delay unit 310, a second delay unit 320, and a third delay unit 330. The first delay unit 310 receives the internal read command signal IRDP, and the second delay unit 320 delays an output signal of the first delay unit 320 according to the control signal CTR. The third delay unit 330 delays an output signal of the second delay unit 320 to output the delayed internal read command signal IRDP_D.

Referring to FIGS. 2 and 8, the first delay unit 310 has the same delay time as that of the clock buffer 21, the second delay unit 320 has the same delay time as that of the second delay line 22 according to the control signal CTR, and the third delay time 330 has the same delay time as that of the duty cycle corrector 24. Therefore, the first delay unit 310 may have the same circuit configuration as the clock buffer 21, the second delay unit 320 may have the same circuit configuration as the second delay line 22, and the third delay unit 330 may have the same circuit configuration as the duty cycle corrector 24. The second delay unit 320 must be controlled by the same signal as the control signal CTR used to control the second delay line 22.

Figure 9:
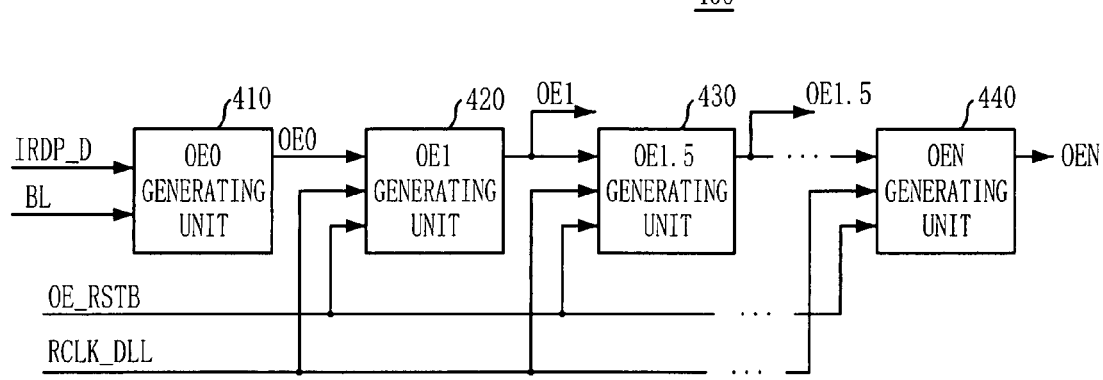
FIG. 9 is a block diagram of an output enable signal generator illustrated in FIG. 7.

FIG. 9 is a block diagram of the output enable signal generator 400 illustrated in FIG. 7.

Referring to FIG. 9, the output enable signal generator 400 includes a plurality of OE generating units. The OE generating units include an OE0 generating unit 410, an OE1 generating unit 420, an OE1.5 generating unit 430, and an OEN generating unit 440. The OE0 generating unit 410 generates the initial output enable signal OE0 having a pulse width corresponding to the burst length BL in response to the delayed internal read command signal IRDP_D. The OE1 generating unit 420 generates the output enable signal OE1 by shifting the output enable signal OE0 in response to the rising DLL clock signal RCLK_DLL. The OE1.5 generating unit 430 generates the output enable signal OE1.5 by shifting the output enable signal OE1 in response to the rising DLL clock signal RCLK_DLL. The OEN generating unit 440 generates the output enable signal OEN. The output enable signals OE1, OE1.5, . . . , OEN, except the output enable signal OE0, synchronize with the rising or falling edge of the rising DLL clock signal RCLK_DLL. Since the OE generating units 410, 420, 430 and 440 have the same configuration as those of the related art, their detailed description will be omitted.

Figure 3:
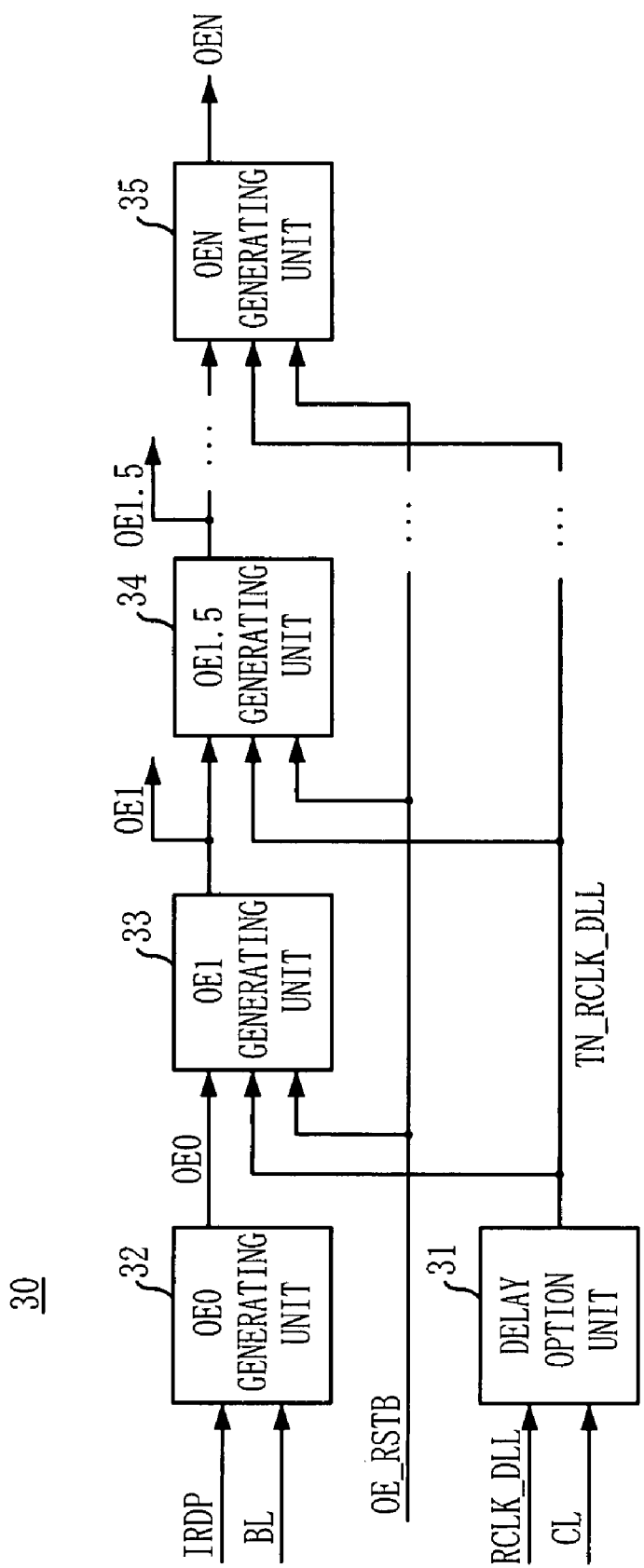
FIG. 3 is a block diagram of an output enable signal generator illustrated in FIG. 1.
Figure 4A:
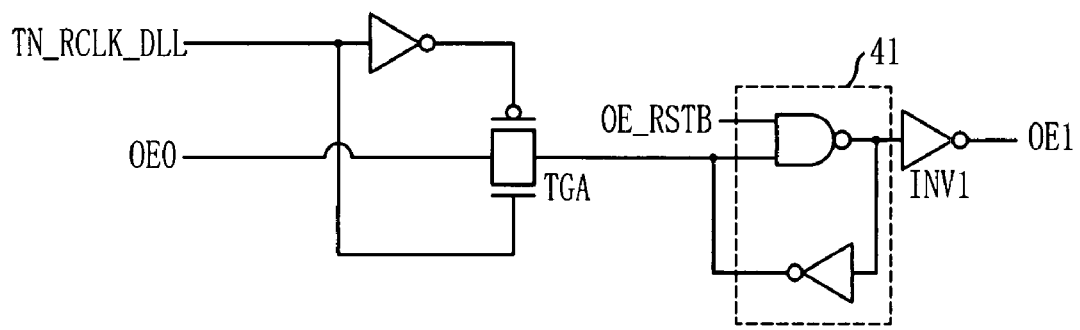
FIGS. 4A and 4B are circuit diagrams of an OE1 generating unit and an OE1.5 generating unit illustrated in FIG. 3, respectively.
Figure 4B:
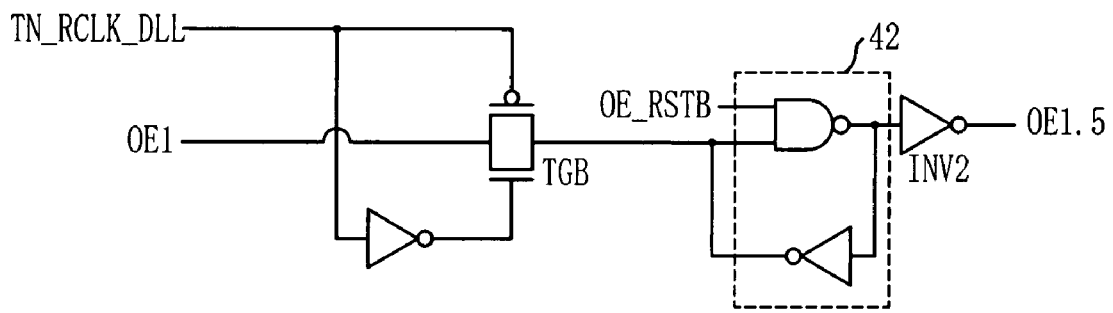
Figure 5:
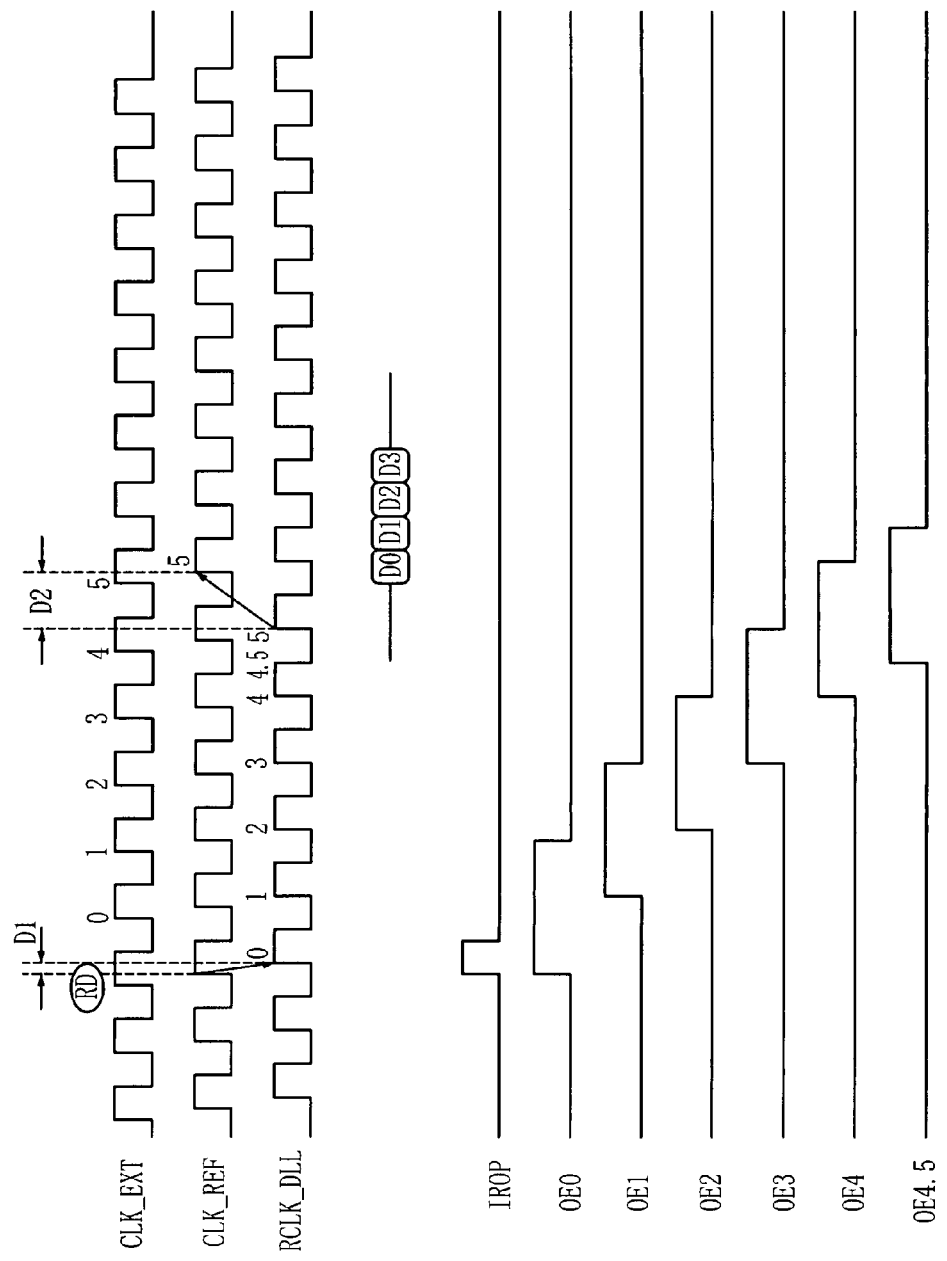
FIGS. 5 and 6 are timing diagrams illustrating the tuning operation of a delay option unit during a domain crossing.
Figure 6:
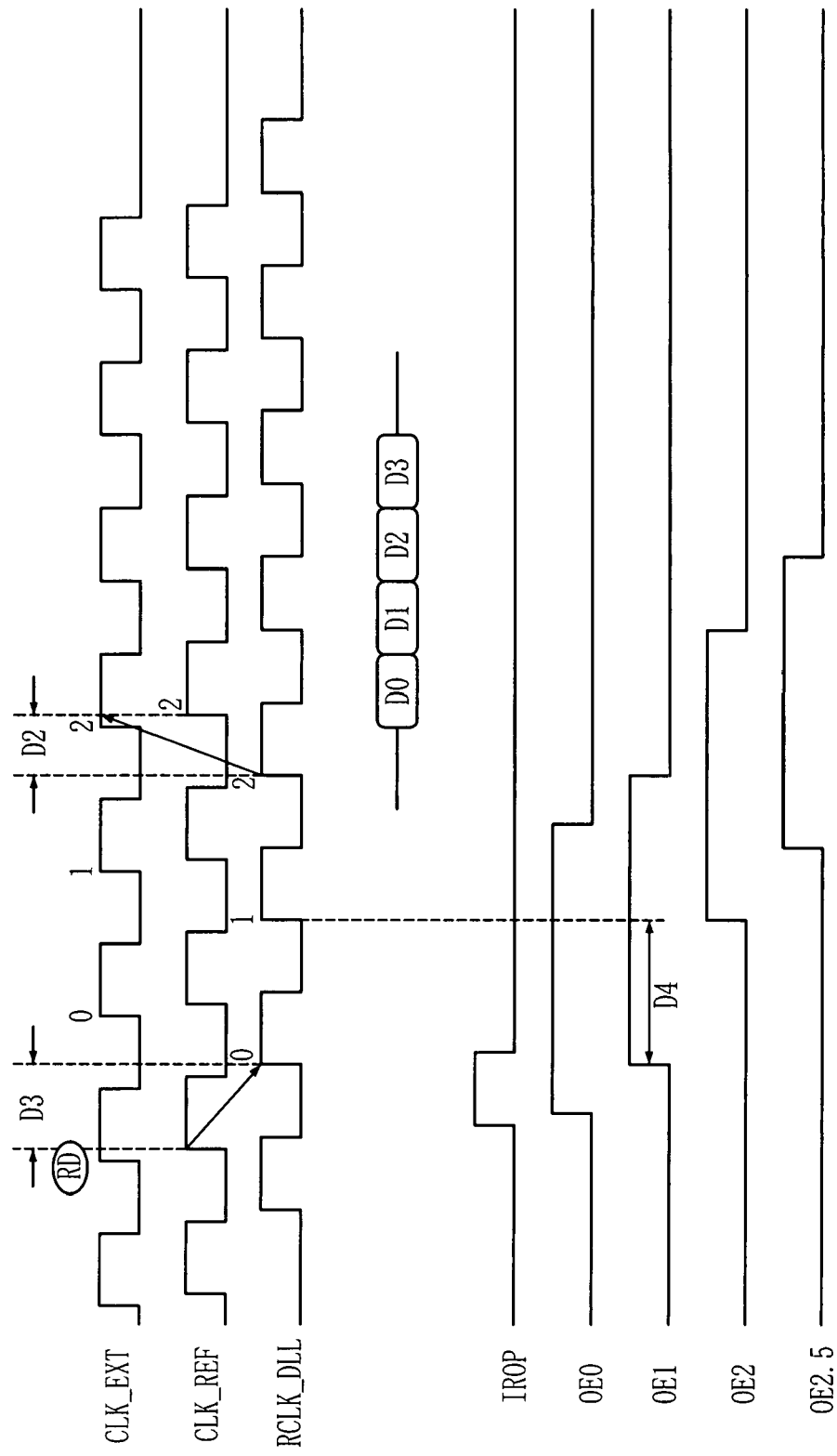

As described above, the conventional semiconductor memory device performs the domain crossing using the delay option unit 31 of FIG. 3 in order for the tuning operation. In this case, the delay option unit 31 is implemented with a large number of delay elements and option circuits. However, the semiconductor memory device in accordance with the present invention delays the internal read command signal IRDP by the delay locked time after the locking of the DLL circuit 200 of FIG. 7, so that the difference between the rising DLL clock signal RCLK_DLL and the output enable signal OE0 are always constant. Therefore, the output enable signals OE1, OE2, OEN subsequently generated are activated in synchronization with the rising DLL clock signal RCLK_DLL.

Consequently, the delay option unit 31 implemented with a large number of delay elements and option circuits can be omitted. In addition, the rising DLL clock signal RCLK_DLL and the output enable signal OE0 always have the same margin and thus the semiconductor memory device can stably operate even at a skew caused by "tCK".

As described above, a large number of delay elements and option circuits can be removed, thereby reducing a circuit area. Since the constant margin is maintained between the DLL clock signal and the initial output enable signal, the semiconductor memory device can stably operate even at a skew caused by "tCK". Moreover, even though "tCK" decreases, the problem caused by the domain crossing can be easily solved.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
a delay locked loop (DLL) for delaying an external clock to generate a DLL clock signal and generating a delay control signal;
an internal command signal generator for generating an internal command signal in response to an external command;
a delay circuit for delaying the internal command signal for a delay time in response to the delay control signal corresponding to a delay time of the DLL to output a delayed internal command signal; and
an output enable signal generator for generating an output enable signal based on the delayed internal command signal and the DLL clock signal,
wherein a phase difference between the DLL clock signal and an initial output enable signal is constant so that subsequent output enable signals are enabled in synchronization with the DLL clock signal.

2. The semiconductor memory device as recited in claim 1, wherein the DLL comprises:
a clock buffer for buffering the external clock signal to generate a reference clock signal;
a delay line for delaying the reference clock signal in response to the delay control signal;
a duty cycle corrector for correcting a duty cycle of an output signal of the delay line to generate the DLL clock signal;
a delay replica model for delaying the DLL clock signal through delay elements located in a clock path to generate a feedback clock signal;
a phase comparator for comparing a phase of the reference clock signal with a phase of the feedback clock signal; and
a delay controller for outputting the delay control signal according to an output value of the phase comparator.

3. The semiconductor memory device as recited in claim 2, wherein the delay circuit comprises:
a first delay unit configured to receive the internal command signal and have the same delay time as that of the clock buffer;
a second delay unit configured to receive an output signal of the first delay unit and have the same delay time as that of the delay line according to the delay control signal; and
a third delay unit configured to receive an output signal of the third delay unit and have the same delay time as that of the duty cycle corrector.

4. The semiconductor memory device as recited in claim 3, wherein the first delay unit has substantially the same circuit configuration as the clock buffer.

5. The semiconductor memory device as recited in claim 3, wherein the second delay unit has substantially the same circuit configuration as the delay line.

6. The semiconductor memory device as recited in claim 3, wherein the third delay unit has substantially the same circuit configuration as the duty cycle corrector.

7. The semiconductor memory device as recited in claim 1, wherein the output enable signal generator comprises:
an initial signal generating unit for generating the initial output enable signal corresponding to a burst length in response to the delayed internal command signal outputted from the delay circuit; and
an output enable signal outputting unit for shifting the initial output enable signal to generate the output enable signal in response to the DLL clock signal.

8. The semiconductor memory device as recited in claim 1, wherein the output enable signal is activated at a preset time point of the DLL clock signal.

9. The semiconductor memory device as recited in claim 7, wherein the output enable signal comprises at least one signal in synchronization with first or second edges of the DLL clock signal.

10. The semiconductor memory device as recited in claim 9, wherein the output enable signal outputting unit comprises:
a first output enable signal outputting unit for receiving the initial output enable signal to output a first output enable signal in synchronization with the first edges of the DLL clock signal; and
a second output enable signal outputting unit for receiving the first output enable signal to output a second output enable signal in synchronization with the second edges of the DLL clock signal.

11. The semiconductor memory device as recited in claim 10, wherein the first output enable signal outputting unit comprises:
- a transfer gate configured to transfer the initial output enable signal in response to the first edge of the DLL clock signal;
- a latch configured to latch an output signal of the transfer gate; and
- a driver configured to drive an output signal of the latch to output the first output enable signal.

12. The semiconductor memory device as recited in claim 10, wherein the second output enable signal comprises:
- a transfer gate configured to transfer the first output enable signal in response to the second edge of the DLL clock signal;
- a latch configured to latch an output signal of the transfer gate; and
- a driver configured to drive an output signal of the latch to output the second output enable signal.

13. The semiconductor memory device as recited in claim 1, wherein the internal command signal contains information on a period of the external clock signal.

14. A method for driving a semiconductor memory device, comprising:
- generating a delay locked loop (DLL) clock signal by delaying an external clock signal until the external clock signal is locked by a DLL and generating a delay control signal;
- generating an internal command signal in response to an external command;
- generating a delayed internal command signal by delaying the internal command signal in response to the delay control signal for a delay time corresponding to a delay time of the DLL; and
- generating an output enable signal based on the DLL clock signal and the delayed internal command signal,
- wherein a phase difference between the DLL clock signal and an initial output enable signal is constant so that subsequent output enable signals are enabled in synchronization with the DLL clock signal.

* * * * *